(12) United States Patent
Voelkl

(10) Patent No.: US 6,617,580 B2
(45) Date of Patent: Sep. 9, 2003

(54) ELECTRON HOLOGRAPHY MICROSCOPE

(75) Inventor: Edgar Voelkl, Austin, TX (US)

(73) Assignee: UT-Battelle, L.L.C., Oak Ridge, TN (US)

( * ) Notice: Subject to any disclaimer, the term of this patent is extended or adjusted under 35 U.S.C. 154(b) by 0 days.

(21) Appl. No.: 10/036,189

(22) Filed: Dec. 27, 2001

(65) Prior Publication Data

US 2003/0122075 A1 Jul. 3, 2003

(51) Int. Cl.$^7$ .................................................. G21K 7/00
(52) U.S. Cl. ........................ 250/311; 250/307; 250/310
(58) Field of Search .............................. 250/311, 492.2, 250/307, 310

(56) References Cited

U.S. PATENT DOCUMENTS

2001/0042830 A1 * 11/2001 Kaneyama et al. ......... 250/311

OTHER PUBLICATIONS

Edgar Voelkl, Lawrence F. Allard and David C. Joy, "Introduction to Electron Holography," 1999, Kluwer Academic/Plenum Publishers, entire book including pp. 1–354.

B.G. Frost, "Image–plane off–axis electron holography: low–magnification arrangements," Meas. Sci. Technol. 10 (1999) 333–339.

* cited by examiner

Primary Examiner—John R. Lee
Assistant Examiner—Phillip A Johnston
(74) Attorney, Agent, or Firm—Gray Cary Ware & Freidenrich, LLP

(57) ABSTRACT

Systems and methods are described for an electron holography microscopy. Changing a size of an electron object image includes maintaining rotation of the electron object image with respect to a final image plane and/or maintaining an aspect ratio defined by an astigmatic object illumination with respect to the final image plane constant by adjusting a condenser electron lens set

21 Claims, 4 Drawing Sheets

ELECTRON HOLOGRAPHY MICROSCOPE

BACKGROUND OF THE INVENTION

1. Field of the Invention

The invention relates generally to the field of electron microscopes. More particularly, the invention relates to transmission electron microscopes. Specifically, a preferred implementation of the invention relates to electron holography microscopes.

2. Discussion of the Related Art

A hologram is an interference pattern that is directly related to the amplitudes and phases of waves, created by the overlapping of an image- and reference- wave. Because of this, an electron hologram is ideal for purposes of quantitative mapping of electrostatic fields mean inner potentials and magnetic fields in and outside of materials, as discussed in detail in "Introduction to Electron Holography", Editors Edgar Voelkl et al[3].

Currently, the common methodology for creating electron holograms is to add an electron biprism to the Transmission Electron Microscope (TEM). In most cases, the biprism is situated behind the back focal plane of the objective lens, perpendicular to the electron beam so that it can split the field of view. A specimen is placed in one side of the visual field so that the other half of the visual field remains empty. Thus half of the emitted electron beam contains the image and the other half is the reference beam, as shown in FIG. 2. The electron beam travels through the condenser lens or condenser lens system 200, shines on the specimen 107, and is magnified by the objective lens 108 before passing the biprism 109 and being separated into two beams. When no voltage is applied to the biprism 109, as shown in FIG. 2A, the beams remain separate. Once a voltage has been applied to the biprism (in this setting a positive voltage), the electron waves on both sides of the biprism are bent toward the center until they overlap to create an interference pattern of parallel fringes, as shown in FIG. 2B.

In addition, the condenser system may be excited such that it forms an elongated shape rather than a circular shape. The long axis of the oval is perpendicular to the electron beam and the biprism in order to improve the contrast of the interference fringes. This detail is also discussed in "Introduction to Electron Holography."[3]

Several TEM models use this method to offer the ability to generate electron holograms as one of their functions. In the Brookhaven National Laboratory model, JEOL-3000F, as shown in FIG. 1, the emitter 101 transmits an electron beam through the accelerator 102, which accelerates the beam. The beam then passes through the first and second condenser lenses, 105 and 106, which adjust intensity and illuminating area of the electron beam before it strikes the specimen 107. The resulting object beam containing an electron image is magnified by the objective lens 108 and encounters an electron biprism 109. The interference pattern is formed below the biprism. The electron image and interference pattern are magnified by the intermediate lens system 110 and the projector lens system 111. A final image can be observed in the viewing chamber 112.

For normal microscope operation, the intermediate lens system (sometimes the first intermediate lens is also called the diffraction lens, e.g., by Philips) as well as the projector lens systems are used to achieve a variable magnification ranging from approximately 4,000 to 2,000,000 times. The objective lens remains usually at a fixed magnification in order to maintain the performance level and image quality. However, it can be turned off for some specific applications as well as for achieving a low magnification of several hundred times. This is the state of the art for any conventional transmission electron microscope (TEM).

A problem with this technology to the present day has been that by introducing a biprism slightly above (or below) an image plane below the object introduces a new system requirement. In order to properly record a hologram, the interference fringes created by the biprism need to be magnified such that they can be recorded usefully on a recording device. If the magnification is too small, the interference fringes become too fine for recording, while over-magnification severely limits the available field of view. Thus, the intermediate and projector lens systems below the biprism are necessary to provide the correct magnification for the interference fringes from the biprism onto the final image or recording plane. As there is an optimum magnification value for interference fringes, the intermediate- and projector-lens systems provide a preset magnification and are no longer available for changing the magnification of the object, as they do in non-holographic modes.

The additional system requirement of electron holography, as caused by the position of the biprism has severe consequences for the use of the electron microscope. As the intermediate and projector lens system is used to provide optimum condition for imaging the interference fringes, the magnification factor from those lenses is fixed and thus only the objective lens remains to accommodate a change of magnification of the object. Obviously, the objective lens alone can not cover the magnification range required for a useful operation of a TEM as the available magnification range for the object becomes minimal.

The use of a TEM for imaging in the holographic mode is further restricted, as the entrance plane of the first lens after the biprism needs to remain approximately fixed; any change of the position of the entrance plane of the first lens below the biprism will affect the number and quality of the interference fringes. For an increase in the number of interference fringes the contrast of the interference fringes decreases and vice versa. Thus, there is an optimum position for the entrance plane of the first lens after the biprism. This makes it very difficult to change the magnification of the objective lens while maintaining the interference fringes unchanged and the object in focus. This leads to the situation that for most TEMs there are only two magnification modes available: "mode one" with the objective lens turned off and "mode two" with the objective lens at its standard excitation. The two modes are well known in literature and called "low resolution mode" and "high resolution mode." (Hitachi microscopes are an exception insofar as the biprism can be installed below the first intermediate lens, and thus there are two lenses available to adjust the magnification of the object while maintaining the interference fringes. However, this is a non-standard operation and severely decreases the overall performance of the instrument (for reasons not to be discussed here and of no consequence for this patent application).

Another problem arises from using a standard TEM for holographic imaging and concerns the second part of the patent application. The condenser system, sometimes partially integrated with the pre-field lens system of the objective lens has to provide an illumination that can handle the full magnification range. A condenser lens system is generally designed such that it provides a round, symmetric illumination at all magnifications. However, at high magnification values the roundness of the illumination has to be fine-tuned by a set of so-called stigmators. These stigmators compensate small deviations of the real condenser system from the ideal system and have practically no effect at low magnifications. In the special case where the objective lens is turned off, the effect of these stigmators is negligible. This means, for the low-resolution-mode with the objective lens off, the illumination is remains round and thus severely limits the use of holography: the number of interference fringes at a reasonable contrast and beam intensity is significantly smaller in the low-resolution-mode than for the high-resolution-mode.

As discussed above, there are several problems with using a standard TEM for basic, routine electron holography. First, using a standard TEM for holography reduces the available magnifications values of the instrument from over 50 to basically two values (for example 10,000 and 500,000 (magnification values vary with brand and type of microscope)). Second, the usability of TEMs for holography is further limited as the astigmatic illumination condition—which allows for a significant improvement in the number of interference fringes at a reasonable contrast—is available in the high-resolution-mode only.

Many specimens that would be of crucial interest for scientists in materials sciences or biological sciences can presently not be investigated by means of electron holography. A solution is presented in this patent application that will allow adapting the magnification to the object while maintaining correct imaging and illumination conditions for the interference fringe pattern.

Heretofore, the requirements of greater magnification possibilities and a more general specimen acceptability for TEMs to produce electron holograms have not been fully met. What is needed is a solution that simultaneously addresses both of these requirements.

SUMMARY OF THE INVENTION

There is a need for the following embodiments. Of course, the invention is not limited to these embodiments.

According to an aspect of the invention, a method comprises: changing a size of an electron object image with a set of electron lenses; creating an interference pattern from the electron object image; and imaging interference fringes of the interference pattern onto an image plane, while not changing a magnification of the interference pattern.

According to another aspect of the invention, an apparatus comprises: a first set of electron lenses adapted to change an electron object image size; an electron biprism coupled to the first set of electron lenses; and a second set of electron lenses coupled to the electron biprism, the second set of electron lenses adapted to image interference fringes of an interference pattern created by the electron biprism onto an image plane without changing a magnification of the interference pattern.

These, and other, embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/or rearrangements.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings, wherein like reference numerals (if they occur in more than one view) designate the same elements. The invention may be better understood by reference to one or more of these drawings in combination with the description presented herein. It should be noted that the features illustrated in the drawings are not necessarily drawn to scale.

DESCRIPTION OF PREFERRED EMBODIMENTS

The invention and the various features and advantageous details thereof are explained more fully with reference to the nonlimiting embodiments that are illustrated in the accompanying drawings and detailed in the following description. Descriptions of well known components and processing techniques are omitted so as not to unnecessarily obscure the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this detailed description.

Within this application several publications are referenced by superscript Arabic numerals. Full citations for these, and other, publications may be found at the end of the specification immediately preceding the claims after the section heading References. The disclosures of all these publications in their entireties are hereby expressly incorporated by reference herein for the purpose of indicating the background of the invention and illustrating the state of the art.

The below-referenced U.S. Patents disclose embodiments that were satisfactory for the purposes for which they are intended. The entire contents of U.S. Pat. Nos. 4,775,790 and 4,748,132 are hereby expressly incorporated by reference herein for all purposes.

The context of the invention can include increased magnification and/or demagnification capabilities for electron holograms. This can include the initial demagnification of the object image as it passes through the first set of magnification electron lenses.

The context of the invention can also include increasing the compatibility of a increased number of specimens. This can allow the viewing of a greater variety of electron holograms.

The context of the invention can also include a different apparatus design. This apparatus can include a set of electron lenses to change an electron object image size, the set of electron lenses adapted to be located between an object and an electron biprism.

Figure 1:
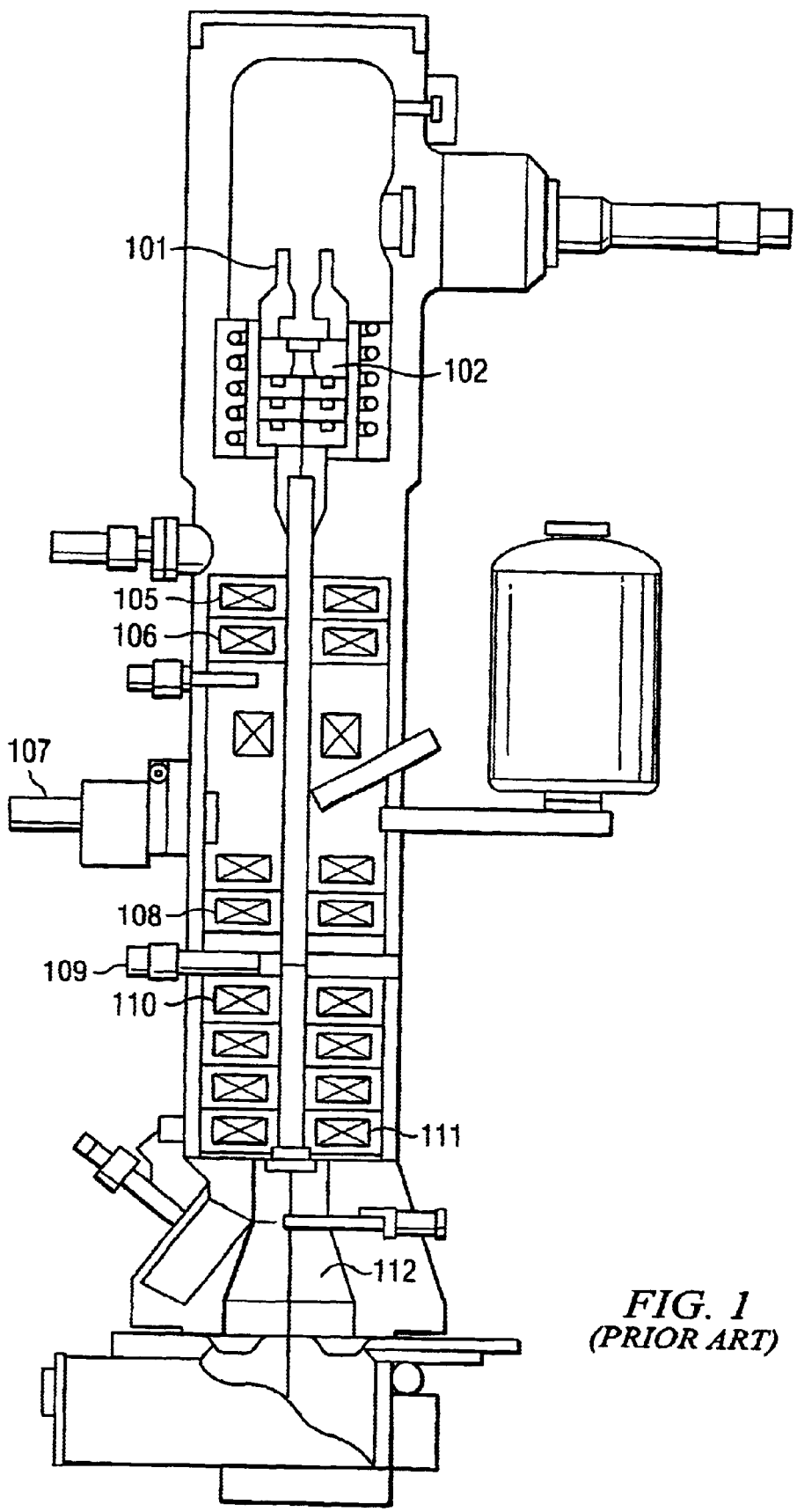
FIG. 1 is an example of a prior-art transmission electron microscope.
Figure 2A:
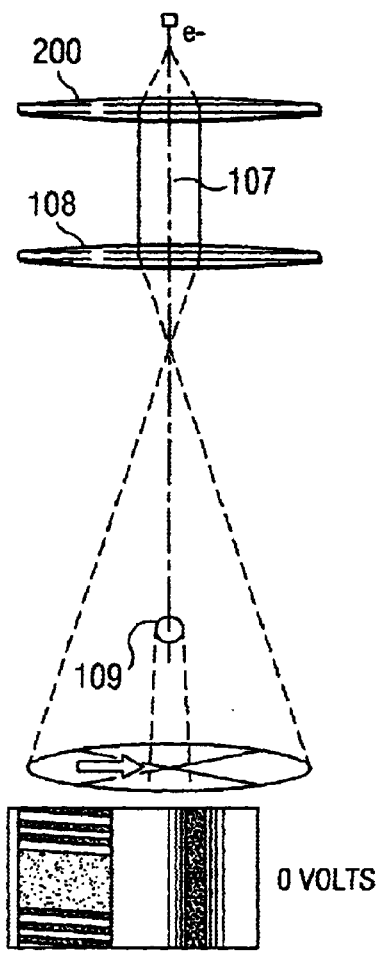
FIG. 2A illustrates a prior-art biprism experiencing no electric charge.
Figure 2B:
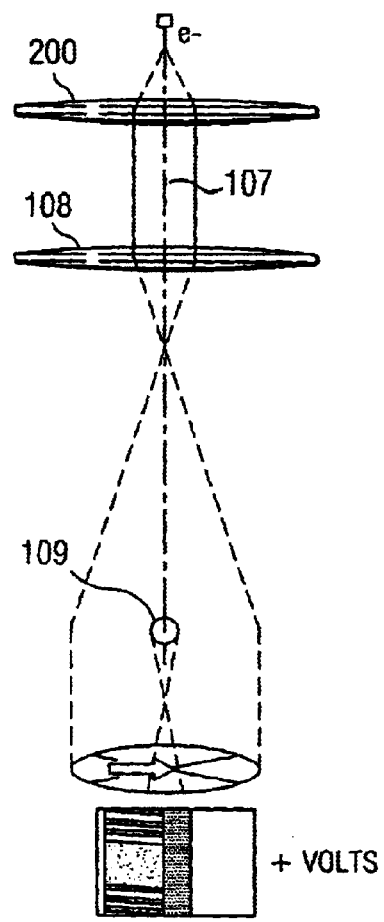
FIG. 2B illustrates a prior-art biprism experiencing a positive charge.
Figure 3A:
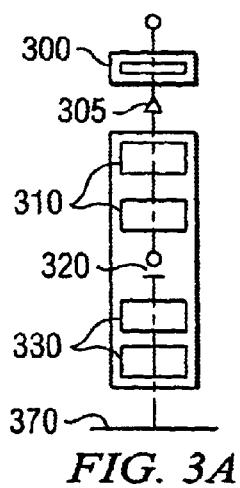
FIG. 3A illustrates a TEM lens configuration, representing an embodiment of the invention.

Although the invention can be embodied in a dedicated electron holography microscope, the invention is not limited to this context. An electron microscope that includes the invention could be configured to operate with the invention in a passive state, for non-holographic uses, thereby providing a non-dedicated electron holography microscope Referring to FIG. 3A, an embodiment of an electron holography apparatus is shown, where an object image from a sample 305 is magnified by "lens set B", 310, having two lenses after the objective lens 300 and before the hologram is created by the biprism 320. These two lenses in "lens set B", 310, are the primary lenses used to change the magnification of the object. The resulting interference patterns formed by the biprism 320 are magnified by the following set of two lenses, "lens set A", 330, which are dedicated to imaging the interference fringes, onto the image plane 370.

Figure 3B:
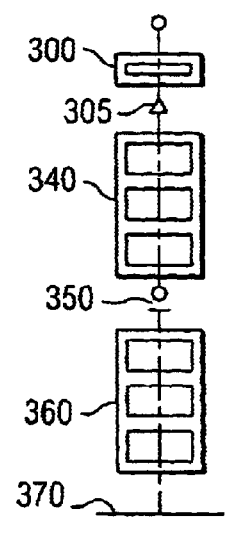
FIG. 3B illustrates another TEM lens configuration, representing an embodiment of the invention.

FIG. 3B shows another embodiment of the invention. After the image from the sample 305 is formed behind the objective lens 300, it is magnified by two lens sets, 340 and 360, with three lenses in each of the lens sets 340 and 360 to perform the required magnification. The distance between "lens set B", 340, and the biprism 350 in FIG. 3B are different from the distance in FIG. 3A, as is the distance between the biprism 350 and "lens set A", 360. The lenses, in this case, could be of smaller aperture and higher coil density than the lens setup shown in FIG. 3A.

This illustrates the fact that the number of lenses in each stage is variable. The quantity of lenses that can be implemented at this stage are not constrained to the numbers shown in these figures. Three lenses above the biprism (including the objective lens) would give an improved magnification range, however to get to a broad applicability, 4 lenses or more are necessary to provide the magnification range that standard microscopes provide (as the last three lenses provide a magnification of possibly 20,000 times, the upper lens system needs to cover a range from $\frac{1}{20}$ to 100 times magnification).

When astigmatic or elliptic illumination is used, possible rotation of the main axis of the ellipse with respect to the biprism must be compensated. In addition, the condenser system may be adjusted such that the shape of the elliptical illumination in the plane where the interference fringes are generated (i.e., between lens set A and B) remains reasonably constant. In addition, the condenser lens system may be modified to incorporate stigmators sufficiently strong to provide a highly astigmatic illumination throughout most or all of the magnification range of the total system. The condenser lens can also be adjusted to ensure that the illumination in the plane where the interference fringes are generated remains reasonably constant.

An alternative version of the invention is by moving the biprism in the condenser lens area above the specimen and by possible modification of the condenser lens system, it would be possible to provide a system that allows the use of differential phase contrast over a large range of magnification. This alternative, however, should not be in competition with the system with lens set A and B, as differential phase contrast presently has a limited applicability.

The invention can also be included in a kit. The kit can include some, or all, of the components that compose the invention. The kit can be an in-the-field retrofit kit to improve existing systems that are capable of incorporating the invention. The kit can include software, firmware and/or hardware for carrying out the invention. The kit can also contain instructions for practicing the invention. Unless otherwise specified, the components, software, firmware, hardware and/or instructions of the kit can be the same as those used in the invention.

The terms a or an, as used herein, are defined as one or more than one. The term another, as used herein, is defined as at least a second or more. The terms including and/or having, as used herein, are defined as comprising (i.e., open language). The term coupled, as used herein, is defined as connected, although not necessarily directly, and not necessarily mechanically. The term program or phrase computer program, as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

EXAMPLES

Specific embodiments of the invention will now be further described by the following, nonlimiting examples which will serve to illustrate in some detail various features. The following examples are included to facilitate an understanding of ways in which the invention may be practiced. It should be appreciated that the examples which follow represent embodiments discovered to function well in the practice of the invention, and thus can be considered to constitute preferred modes for the practice of the invention. However, it should be appreciated that many changes can be made in the exemplary embodiments which are disclosed while still obtaining like or similar result without departing from the spirit and scope of the invention. Accordingly, the examples should not be construed as limiting the scope of the invention.

Example 1

Figure 4:
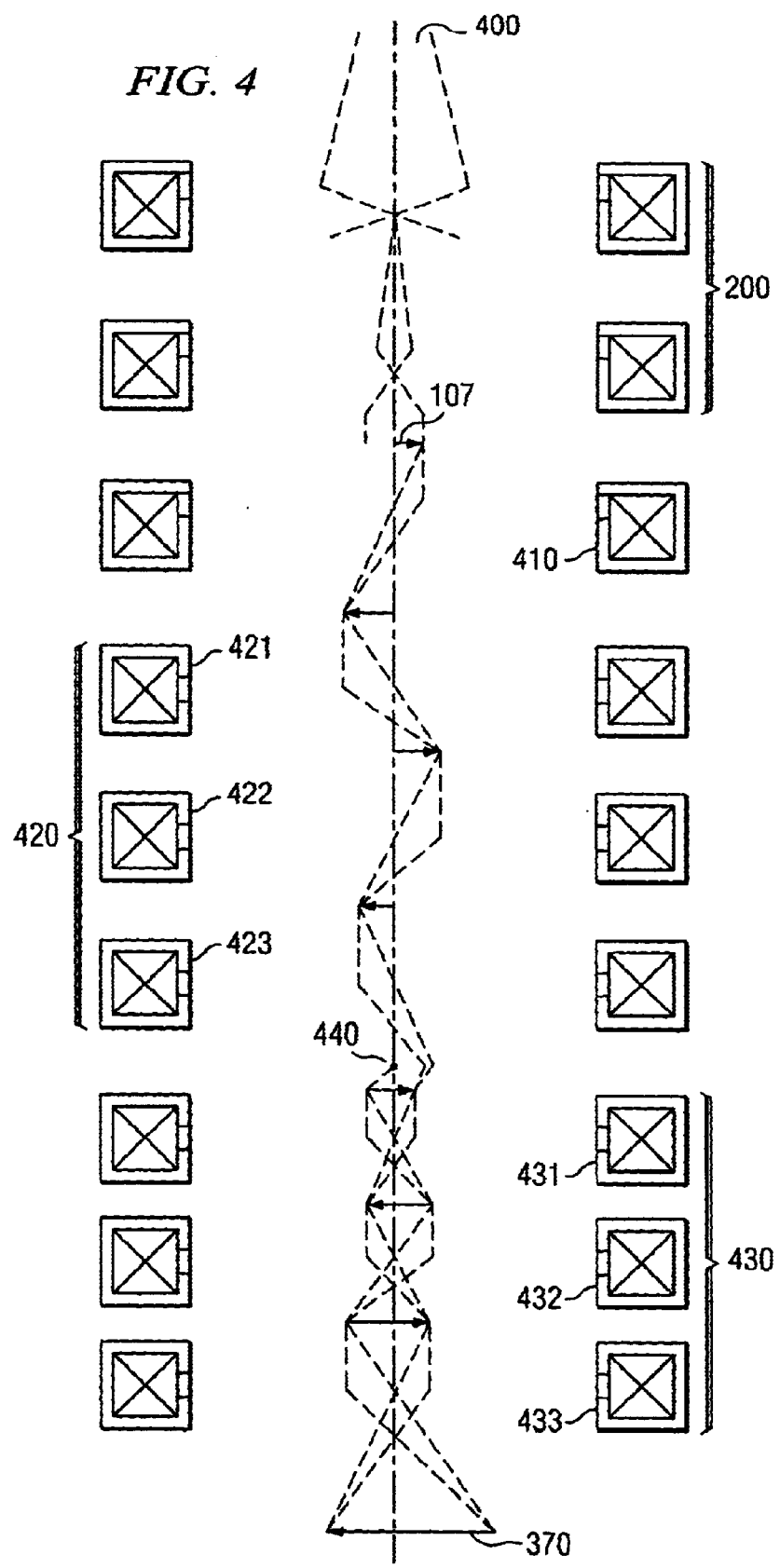
FIG. 4 illustrates another TEM lens configuration, representing an embodiment of the invention.

FIG. 4 shows an embodiment of the invention. It illustrates how a magnified image and interference pattern can be formed with this invention. An electron beam 400 passes through the condenser lenses 200 which adjusts the intensity and illumination area of the beam as is required.

The electron beam 400 strikes the object to be imaged 107, and the resulting object beam is focused by the objective lens 410. The objective lens is a critical lens because any aberrations that it may form will be further magnified by the lenses that follow it. For this reason, a narrow-gap objective lens, due to its smaller aberration coefficients. However, in order to minimize magnetic fields and provide space for tilting the sample with large angles a wide gap objective lens is desirable. To reduce the increase in aberrations associated with the wide gap, a spherical aberration corrector is recommended to be coupled with the objective lens. It will help to maintain lateral resolution capabilities while providing more space in the specimen area.

After the beam exits the objective lens 410, it passes through the three lenses, 421, 422, and 423, in lens set B 420. As the object beam exits lens set B 420, the object image is de-magnified. Demagnification of the image at this point is important, in some cases, to compensate the (almost) fixed magnification factor given by the lens set dedicated to image the interference fringes.

The object beam passes through the biprism 440, where the object and incident beams overlap to create an interference pattern. The interference pattern and the image then pass through the three lenses, 431, 432, and 433, in lens set A 430, for magnification before shining onto the image plane 370.

Example 2

Figure 5:
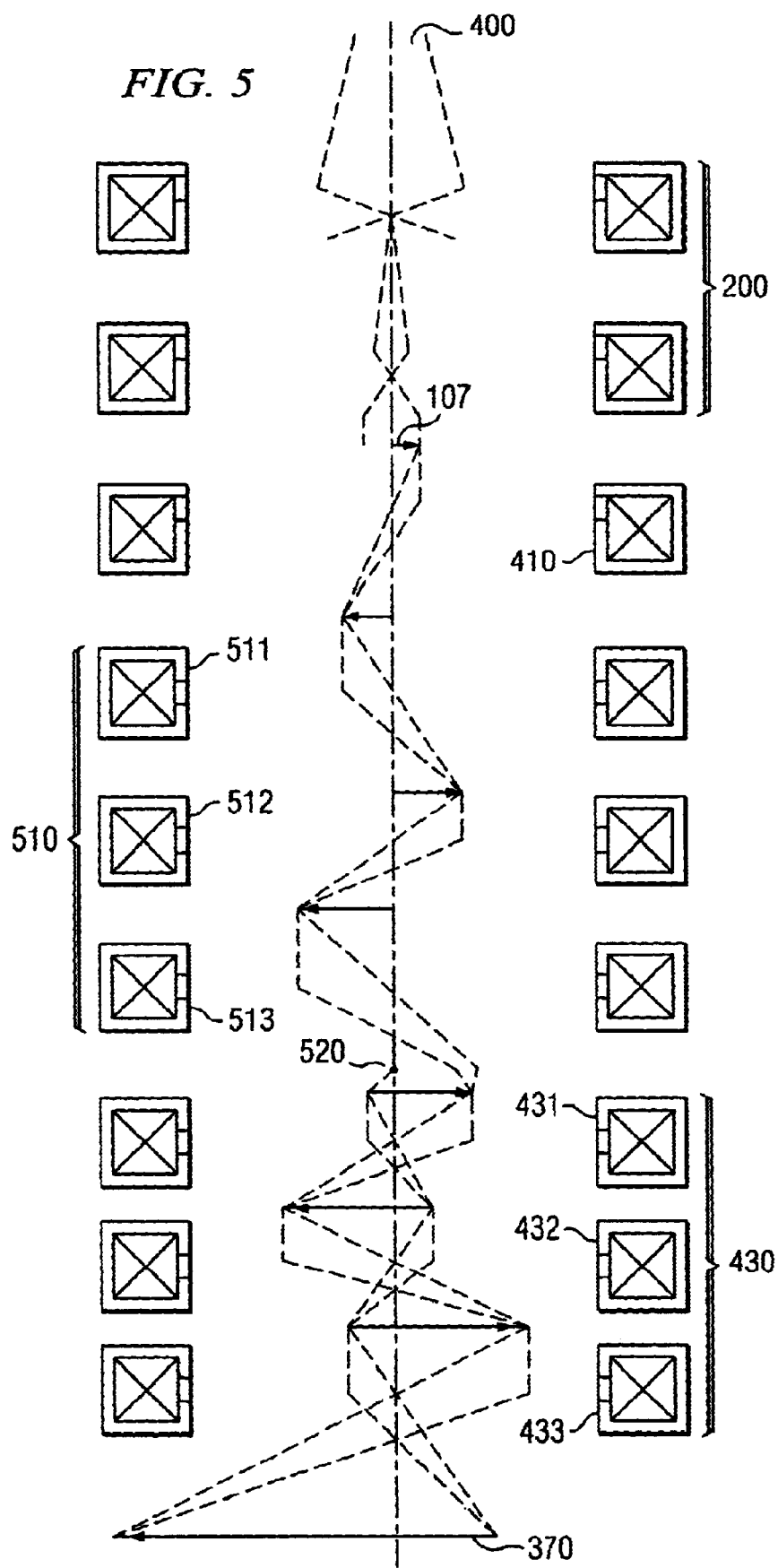
FIG. 5 illustrates another TEM lens configuration, representing an embodiment of the invention.

FIG. 5 shows another embodiment of the invention. An electron beam 400 passes through the condenser lenses 200 where its intensity and field of view is adjusted, shines on the object 107, and the resulting image beam is focused by the objective lens 410. All of the specifics discussed in Example 1 regarding the condenser and objective lens still apply in this example.

Before the beam converges, it enters the 3 lenses 511, 512, 513 of lens set B 510. As the objective beam exits lens set B 510, the object image is magnified.

In addition to its main magnification function, lens set B 510 should be able to control and adjust for the object image rotation with respect to the final image. Object rotation is a function of the magnification change and needs to be compensated for.

After exiting lens set B 510, the object beam 400 passes through the biprism 520, where the object and incident beams overlap to create an interference pattern. The interference pattern and the image then pass through the three lenses, 431, 432, 433, in lens set A 430 for magnification before shining onto the image plane 370. After the image and interference beams have passed through the last lens 433, the final image will be larger than the final image in Example 1.

The number of lenses in lens sets A 430 and B 510 are variable and are not limited to the quantities shown in the figures. The desired magnification of the object can only be obtained by using the lens set between the object and the biprism, while compensating the magnification factor as given by the lens set between the biprism and a final image plane. This can lead to a required magnification factor <1 for the lens set between the object and the biprism. Given that the lenses are electron lenses, the amount of current running through the lenses determine the focal point and magnification of each lens. The changing of the current when holding the focal point of the lenses constant will change the orientation of the image relative to the final image, as stated in U.S. Pat. No. 4,775,790. Not all of the lenses in a lens set have to be used to cause a change of focal point or magnification of a lens set, or to rotate an electron object image.

As the magnification settings of the lenses in lens sets A 430 is predetermined by optimizing the interference fringes, only the lens set B 510 can provide for the required magnification range. A change in magnification in lens set B 510 will change the size of the object in the interference pattern, while a change to lens set A 430 will decrease or increase the field of view but only slightly change the overall magnification of the object. This allows for a greater variation of objects that will be compatible with the rather limited interference pattern of electron holograms.

Practical Applications of the Invention

A practical application of the invention that has value within the technological arts is to facilitate the determination of morphologic structures for nano- and sub-nano technology. While instruments like the scanning electron microscope (SEM) provide a surface display down to the nanometer level, the technique of holography allows to understand the internal structures as well, as the technique is used in transmission. For example, this technique allows to detect voids and characterize them as such. Also, the technique is very sensitive to small changes in materials caused for example by doping of silicon. This is of great value for the semiconductor industry, as there is presently no other technique that allows to determine doping profiles from a volume area instead of a surface.

The biology/medical area would greatly benefit from this invention for at least two reasons: the holographic reconstruction method eliminates the large background contributions from inelastically scattered electrons detrimental to the image quality. In general this invention provides an ideal transfer function for imaging, i.e., the "large area contrast", ideal for biological materials. In fact, this invention is appropriate in all areas where phase contrast imaging is necessary. There are virtually innumerable uses for the invention, all of which need not be detailed here.

Advantages of the Invention

A transmitting electron holography microscope and associate methods, representing an embodiment of the invention, can be cost effective and advantageous for at least the following reasons. The invention increases the range of magnification available for electron holography. The invention also increases the compatibility of a greater number of specimens with the field of electron holography. The invention improves quality and/or reduces costs compared to previous approaches.

All the disclosed embodiments of the invention disclosed herein can be made and used without undue experimentation in light of the disclosure. Although the best mode of carrying out the invention contemplated by the inventor is disclosed, practice of the invention is not limited thereto. Accordingly, it will be appreciated by those skilled in the art that the invention may be practiced otherwise than as specifically described herein.

Further, the individual components need not be formed in the disclosed shapes, or combined in the disclosed configurations, but could be provided in virtually any shapes, and/or combined in virtually any configuration. Further, variation may be made in the steps or in the sequence of steps composing methods described herein. Further, although the lens set described herein can be a separate module, it will be manifest that the lens set may be integrated into the system with which it is associated. Furthermore, all the disclosed elements and features of each disclosed embodiment can be combined with, or substituted for, the disclosed elements and features of every other disclosed embodiment except where such elements or features are mutually exclusive.

It will be manifest that various substitutions, modifications, additions and/or rearrangements of the features of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

REFERENCES 1. http://www.bnl.gov/term/images/Slide2.JPG, Brookhaven National Laboratory, Aug. 21, 2001.
2. http://www.oml.gov/ORNLReview/rev28-4/text/electron.htm, *Oak Ridge National Laboratory Review*, Volume 28, Number 4, 1995.
3. *Introduction to Electron Holography*, Eds. E. Voelkl et al., Kluwer Academic/Plenum Publishers, 1999.
4. The Electrical Engineering Handbook, CRC Press, (Richard C. Dorf et al. eds.), 1993.
5. U.S. Pat. No. 4,775,790, Transmission Electron Microscope, 1988.
6. U.S. Pat. No. 4,748,132, Micro Fabrication Process for Semiconductor Structure Using Coherent Electron Beams, 1988.

What is claimed is:

1. A method, comprising:
    changing a size of an electron object image with a set of electron lenses;
    creating an interference pattern from the electron object image; and
    imaging interference fringes of the interference pattern onto an image plane, while not changing a magnification of the interference pattern,
    wherein changing the size of the electron object image includes maintaining a rotation of the electron object image defined by an astigmatic object illumination with respect to a final image plane constant by adjusting the astigmatic object illumination by adjusting a condenser.

2. The method of claim 1, wherein changing the size of the electron object image includes maintaining an aspect ratio defined by an astigmatic object illumination with respect to the final image plane constant by adjusting the astigmatic object illumination by adjusting a condenser electron lens set.

3. The method of claim 1, wherein changing the size of the electron object image includes demagnifying the electron object image at a power of $\frac{1}{20}$.

4. The method of claim 1, wherein changing the size of the electron object image includes demagnifying the electron object image.

5. A method, comprising:
    changing a size of an electron object image with a set of electron lenses;
    creating an interference pattern from the electron object image; and
    imaging interference fringes of the interference pattern onto an image plane, while not changing a magnification of the interference pattern,
    wherein changing the size of the electron object image includes maintaining an aspect ratio defined by an astigmatic object illumination with respect to the final image plane constant by adjusting the astigmatic object illumination by adjusting a condenser electron lens set.

6. The method of claim 1, wherein changing the size of the electron object image includes maintaining an intensity distribution with respect to a final image plane by adjusting an illumination.

7. The method of claim 5, wherein changing the size of the electron object image includes maintaining the aspect ratio as well as an intensity distribution defined by an astigmatic object illumination with respect to a final image plane by adjusting the astigmatic object illumination.

8. The method of claim 5, wherein changing the size of the electron object image includes maintaining rotation of the electron object image with respect to a final image plane constant.

9. An apparatus, comprising
    an electron beam emitter;
    a condenser electron lens set coupled to the electron beam emitter;
    a first set of electron lenses coupled to the condenser electron lens set, the first set of electron lenses adapted to change an electron object image size;
    an electron biprism coupled to the first set of electron lenses; and
    a second set of electron lenses coupled to the electron biprism, the second set of electron lenses adapted to image interference fringes of an interference pattern created by the electron biprism onto an image plane without changing a magnification of the interference pattern,
    wherein the condenser electron lens set, which may include the pre-field of the objective lens, is sufficiently strong to maintain an astigmatic illumination condition with respect to a final image plane independent of a selected magnification of the first set of electron lenses and the astigmatic illumination condition includes rotation of the electron object image with respect to the final image plane.

10. The apparatus of claim 9, wherein the first set of electron lenses includes a wide-gap objective lens.

11. The apparatus of claim 10, further comprising a spherical aberration corrector coupled to the wide-gap objective lens.

12. The apparatus of claim 9, wherein the condenser electron lens set is sufficiently strong to maintain another astigmatic illumination condition with respect to a final image plane independent of the selected magnification of the first set of electron lenses and the another astigmatic illumination condition includes an aspect ratio with respect to the final image plane.

13. The apparatus of claim 9, wherein the condenser lens set includes stigmators that maintain the astigmatic illumination condition of rotation of the electron object image with respect to the final image plane.

14. The apparatus of claim 9, wherein the first set of lenses demagnify the electron object image.

15. The apparatus of claim 9, wherein the condenser electron lens set is sufficiently strong to maintain another astigmatic illumination condition with respect to a final image plane independent of the selected magnification of the first set of electron lenses and the another astigmatic illumination condition includes an intensity distribution with respect to the final image plane.

16. The apparatus of claim 17, wherein the condenser electron lens set is sufficiently strong to maintain another astigmatic illumination condition with respect to a final image plane independent of the selected magnification of the first set of electron lenses and the another astigmatic illumination condition includes an intensity distribution with respect to the final image plane.

17. An apparatus, comprising
    an electron beam emitter;
    a condenser electron lens set coupled to the electron beam emitter;
    a first set of electron lenses coupled to the condenser electron lens set, the first set of electron lenses adapted to change an electron object image size;

an electron biprism coupled to the first set of electron lenses; and a second set of electron lenses coupled to the electron biprism, the second set of electron lenses adapted to image interference fringes of an interference pattern created by the electron biprism onto an image plane without changing a magnification of the interference pattern, wherein the condenser electron lens set, which may include the pre-field of the objective lens, is sufficiently strong to maintain an astigmatic illumination condition with respect to a final image plane independent of a selected magnification of the first set of electron lenses and the astigmatic illumination condition includes an aspect ratio with respect to the final image plane.

18. The apparatus of claim 17, wherein the first set of electron lenses demagnify the electron object image.

19. The apparatus of claim 17, wherein the condenser electron lens set is sufficiently strong to maintain another astigmatic illumination condition with respect to a final image plane independent of the selected magnification of the first set of electron lenses and the another astigmatic illumination condition includes rotation of the electron object image with respect to the final image plane.

20. The method of claim 5, wherein changing the size of the electron object image includes demagnifying the electron object image.

21. The method of claim 1, wherein maintaining rotation of the electron object image with respect to a final image plane constant includes adjusting stigmators that are incorporated in the condenser.

* * * * *